(12) United States Patent
Chiu et al.

(10) Patent No.: US 10,847,394 B2
(45) Date of Patent: Nov. 24, 2020

(54) WAFER CONTAINER WITH A SEAL

(71) Applicant: Chung King Enterprise Co., Ltd., Taoyuan (TW)

(72) Inventors: Ming-Long Chiu, Taoyuan (TW); Tsung-Yi Yang, Taoyuan (TW); Yen-Fang Chen, Taoyuan (TW); Chia-Ling Li, Taoyuan (TW)

(73) Assignee: CHUNG KING ENTERPRISE CO., LTD., Taoyuan (TW)

( * ) Notice: Subject to any disclaimer, the term of this patent is extended or adjusted under 35 U.S.C. 154(b) by 258 days.

(21) Appl. No.: 16/043,335

(22) Filed: Jul. 24, 2018

(65) Prior Publication Data
US 2019/0067063 A1 Feb. 28, 2019

(30) Foreign Application Priority Data
Aug. 25, 2017 (TW) .............................. 106212588 U

(51) Int. Cl.
*H01L 21/673* (2006.01)

(52) U.S. Cl.
CPC .. *H01L 21/67383* (2013.01); *H01L 21/67366* (2013.01); *H01L 21/67376* (2013.01); *H01L 21/67379* (2013.01); *H01L 21/67386* (2013.01); *H01L 21/67393* (2013.01)

(58) Field of Classification Search
CPC ... B65D 85/48; H01L 21/67; H01L 21/67366; H01L 21/67376; H01L 21/67379; H01L 21/67383; H01L 21/67386; H01L 21/67393; H01L 21/673
USPC ................................................ 206/710, 711
See application file for complete search history.

(56) References Cited

U.S. PATENT DOCUMENTS

| | | | | | |
|---|---|---|---|---|---|
| 5,988,392 | A | * | 11/1999 | Hosoi | H01L 21/67373 206/711 |
| 6,105,782 | A | * | 8/2000 | Fujimori | H01L 21/67376 206/710 |
| 6,273,261 | B1 | * | 8/2001 | Hosoi | H01L 21/67379 206/710 |
| 7,100,772 | B2 | * | 9/2006 | Burns | H01L 21/67383 206/710 |
| 7,344,030 | B2 | * | 3/2008 | Burns | H01L 21/67373 206/454 |
| 7,413,099 | B2 | * | 8/2008 | Takahashi | B65D 53/02 206/710 |
| 8,292,081 | B2 | * | 10/2012 | Sasaki | H01L 21/67376 206/710 |

FOREIGN PATENT DOCUMENTS

EP          0744765 A1 * 11/1996  ....... H01L 21/67369

* cited by examiner

*Primary Examiner* — Bryon P Gehman
(74) *Attorney, Agent, or Firm* — Hamre, Schumann, Mueller & Larson, P.C.

(57) ABSTRACT

A wafer container includes a container body and a door. The container body has a pair of upright side walls, a top wall, a bottom wall and a rear wall cooperatively defining a container space with a front access opening. The door is removably engaged with the container body to close and seal the front access opening, and includes a front door panel, a rear door panel, and sealing means which is disposed at a periphery of the front door panel and configured to seal the gap between the door and the container body when the door is engaged with the container body to close the front access opening.

14 Claims, 11 Drawing Sheets

WAFER CONTAINER WITH A SEAL

CROSS-REFERENCE TO RELATED APPLICATION

This application claims priority of Taiwanese Patent Application No. 106212588, filed on Aug. 25, 2017.

FIELD

The disclosure relates to a wafer container, and more particularly to a sealed front-opening wafer container.

BACKGROUND

Wafers are essential substrates used in the semiconductor manufacturing process. A sealed container for accommodating wafers is used to prevent breakage and contamination of the wafers during transportation.

A conventional wafer container generally includes a container body and a door cooperatively defining a closed space. An annular gasket is disposed in an annular groove of a periphery of the door to be sealingly fitted in a clearance between the door and the container body. Such annular gasket is liable to be undesirably released from the groove and the door.

Moreover, it is required to bond a wafer to a metal frame by an adhesive tape to maintain the wafer during dicing operations, which results in undesired weight increment during transportation. To reduce the load of transportation devices or operators, it is advantageous to reduce the weight of the wafer container or the wafer frame box. On the other hand, a structural strength and a protective effect of the wafer container/wafer frame box must be increased with a load rise.

However, a conventional wafer container/wafer frame box generally includes numerous plates made from a high-strength material (such as metal) and assembled with each other, thus being heavy in weight and weak in structure (due to the assembly-type structure).

Additional reinforcement structure is proposed to enhance the structural strength, which causes weight increment. Therefore, a need has arisen for a wafer container to reduce the weight thereof without compromising the structural strength of the container and the protective effect to wafers.

SUMMARY

Therefore, an object of the disclosure is to provide a wafer container that can alleviate at least one of the drawbacks of the prior art.

According to the disclosure, the wafer container includes a container body and a door. The container body has a pair of upright side walls which are spaced apart from each other in a left-and-right direction, a top wall interconnecting upper ends of the side walls, a bottom wall interconnecting lower ends of the side walls, a rear wall connected to a rear end of each of the side, the top and the bottom walls, and a base seat disposed under the bottom wall. The side, the top and the bottom walls together define within the container body a container space having a front access opening opposing to the rear wall. The door is removably engaged with the container body to close and to seal the front access opening. The door includes a front door panel, a rear door panel, and sealing means. A periphery of the front door panel is larger than a periphery of the rear door panel. The sealing means is disposed at the periphery of the front door panel and configured to seal a gap between the door and the container body when the door is engaged with the container body to close the front access opening.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
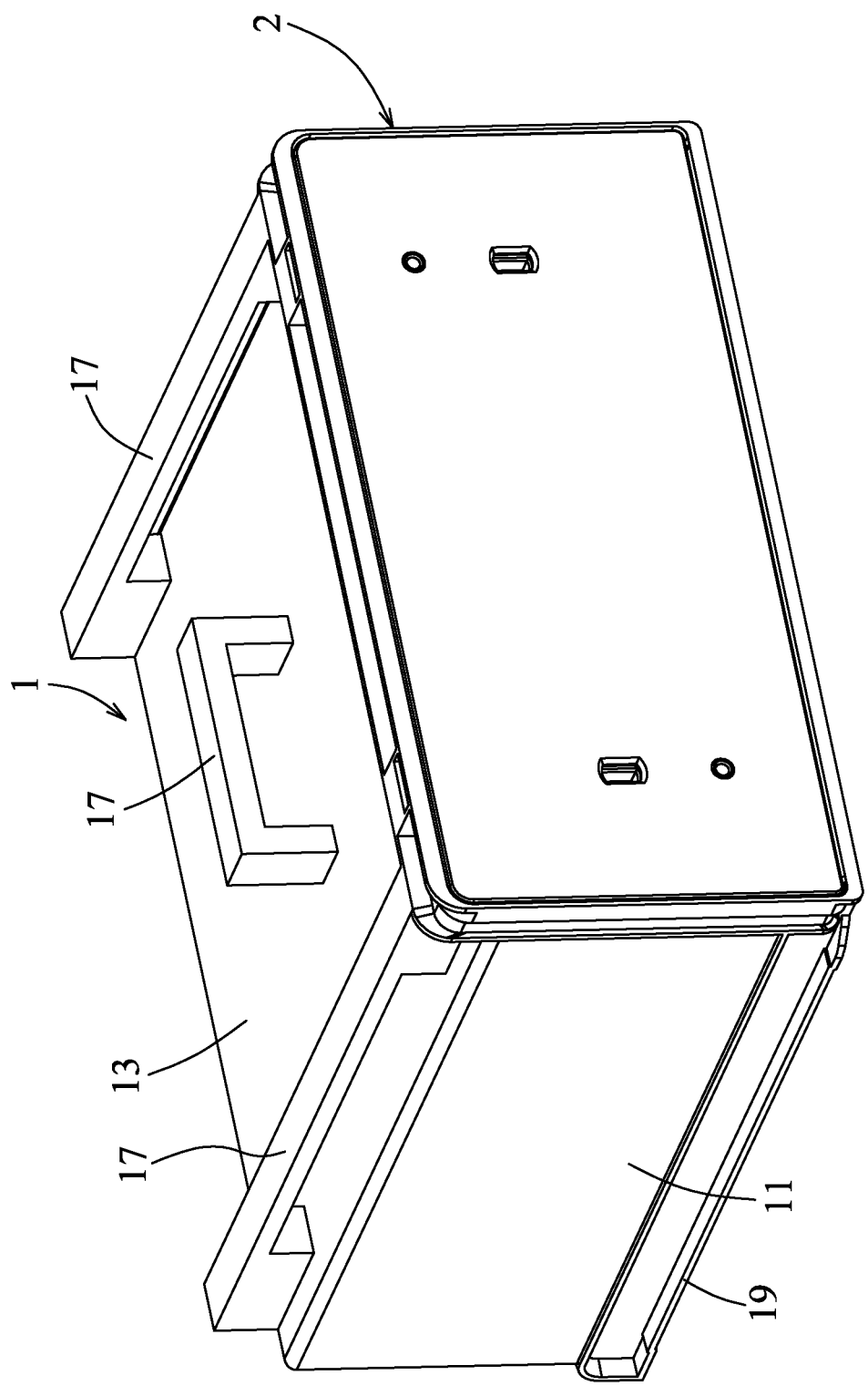
FIG. 1 is a perspective view illustrating an embodiment of a wafer container according to the disclosure.

Referring to FIGS. 1 to 4, an embodiment of a wafer container according to the disclosure includes a container body 1 and a door 2.

The container body 1 has a pair of upright side walls 11 which are spaced apart from each other in a left-and-right direction, a top wall 13 interconnecting upper ends of the side walls 11, a bottom wall 12 interconnecting lower ends of the side walls 11, and a rear wall 14 connected to a rear end of each of the side, top and bottom walls 11, 13, 12, and a base seat 19 disposed under the bottom wall 12. The side, top and bottom walls 11, 13, 12 together define within the container body 1 a container space 15 having a front access opening 16 opposing to the rear wall 14.

The side walls 11, the top wall 13, the rear wall 14 and the bottom wall 12 are integrally formed with each other as a one-single piece structure.

Figure 3:
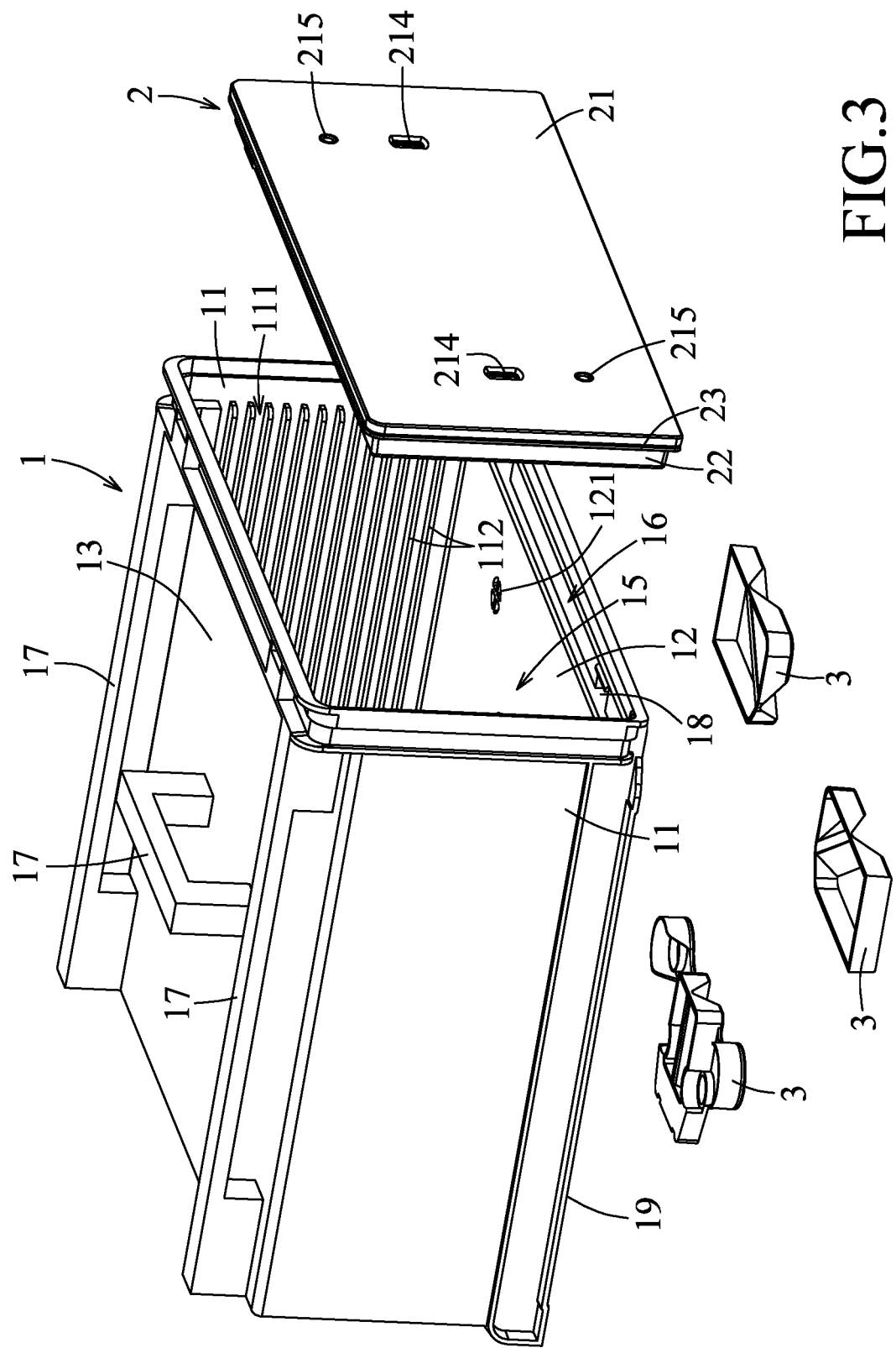
FIG. 3 is an exploded perspective view of the embodiment.

With reference to FIGS. 1 and 3, the door 2 is removably engaged with the container body 1 to close and to seal the front access opening 16 so as to seal the container space 15. That is, the wafer container of this embodiment is a front-opening wafer container.

With reference to FIGS. 5 to 8, the door 2 includes a front door panel 21, a rear door panel 22 and sealing means. A periphery of the front door panel 21 is larger than a periphery of the rear door panel 22.

The front door panel 21 has a front major wall 211 having a rearwardly facing wall surface 2111, a rim flange 212 extending rearwardly from a periphery of the front major wall 211, and a plurality of first interlocking members 213 disposed on the rearwardly facing wall surface 2111.

The rear door panel 22 has a rear major wall 221 having a forwardly facing wall surface 2211, a rim flange 222 extending forwardly from a periphery of the rear major wall 221, and a plurality of second interlocking members 223 disposed on the forwardly facing wall surface 2111 to be fitted to the first interlocking members 213, respectively, so as to firmly connect the front and rear door panels 21, 22.

In this embodiment, each of the first and second interlocking members 213, 223 is in form of a flexible hook such that the corresponding first and second interlocking members 213, 223 can be snap-fitted to each other. The periphery of the rear door panel 22 is smaller than that of the front door panel 21 such that the rim flange 212 surrounds the rim flange 222.

In this embodiment, the sealing means includes a seal rim 23 in the form of an annular gasket which is disposed at the periphery of the front door panel 21. The seal rim 23 may be made from an elastomeric material, such as rubber, plastic, etc. to provide a sealing tightness between the container body 1 and the door 2. The rim flange 212 of the front door panel 21 surrounds and is spaced apart from the rim flange 222 of the rear door panel 22 by an annular space for accommodating the seal rim 23.

Additionally, the sealing means may be also disposed on the rearwardly facing wall surface 2111 of the front door panel 21 in an integral form and configured to be matingly and sealingly engaged with the periphery of the access opening 16.

Figure 9:
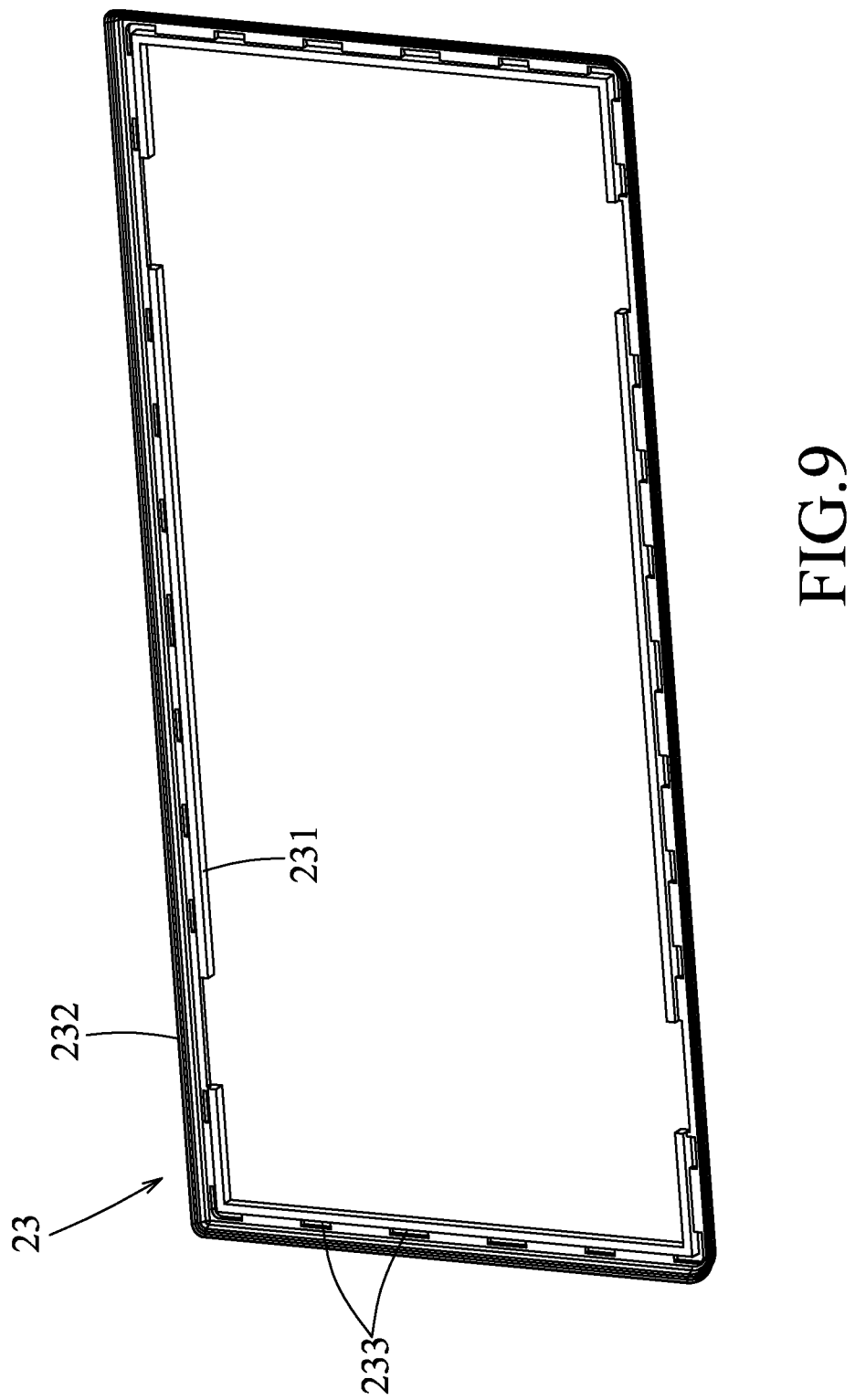
FIG. 9 is a perspective view of a seal rim on the door.
Figure 10:
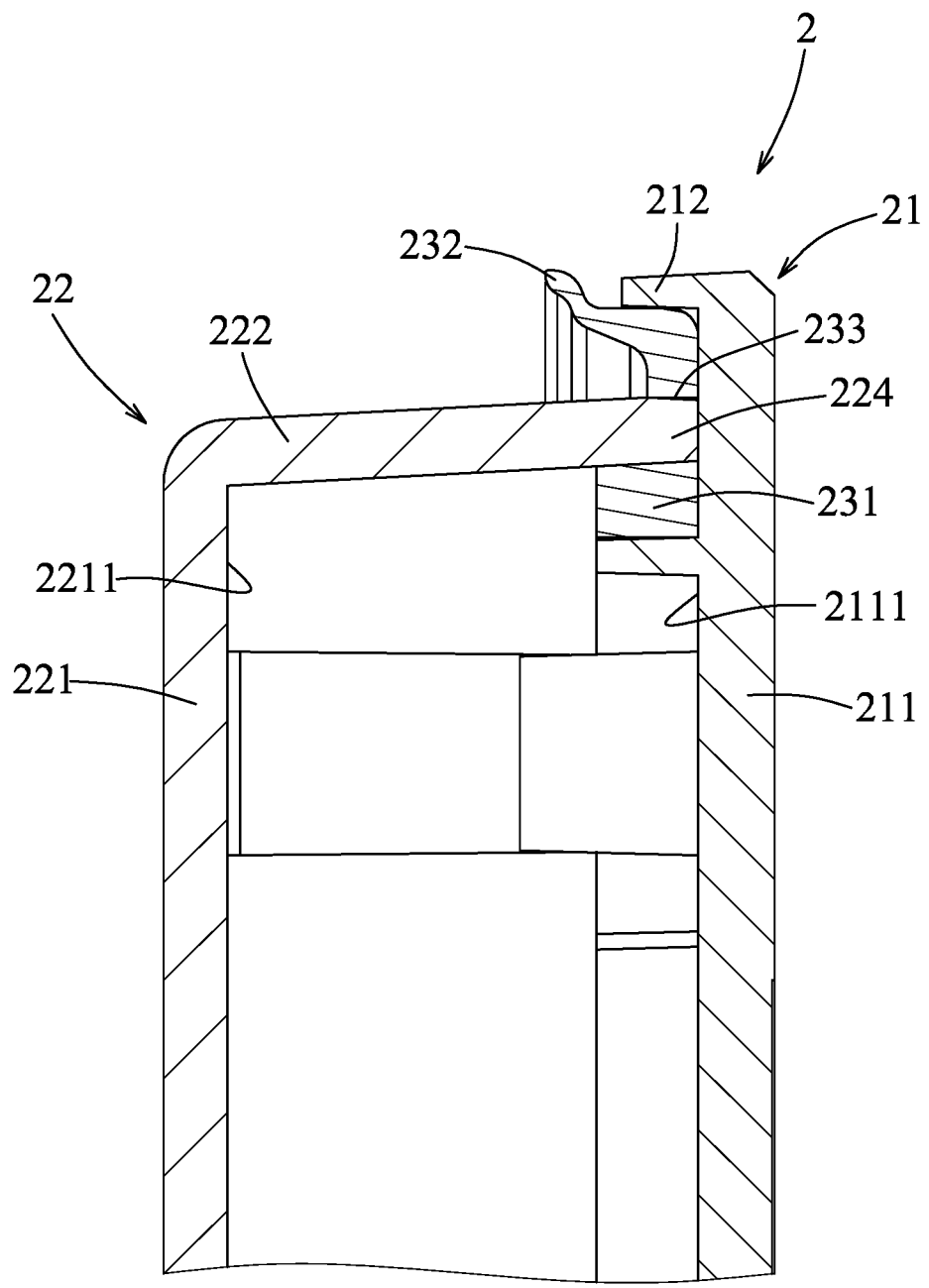
FIG. 10 is a fragmentary sectional view illustrating the door of the embodiment.

With reference to FIGS. 9 and 10, the seal rim 23 has a retained portion 231 that is sandwiched between the front door panel 21 and the rear door panel 22 to be retained tightly, and a sealing portion 232 which extends rearwardly and outwardly from the retained portion 231 and which is disposed between the outer peripheries of the front door panel 21 and the rear door panel 22 so as to be in pressure contact with the container body 1 (see FIG. 3) to be tightly fitted into a clearance between the container body 1 and the door 2.

In this embodiment, the retained portion 231 of the seal rim 23 has a plurality of positioning bores 233. Each of the positioning bores 233 is extending through the retained portion 231 in the front-and-rear direction. The rear door panel 22 has a plurality of protrusions 224 which extend from the rim flange 222 and are fitted in the positioning bores 233, respectively.

In assembling the door 2, the seal rim 23 is attached to the rear door panel 22 by fitting the protrusions 224 in the positioning bores 233. The front door panel 21 is attached to the rear door panel 22 by snap-fitting the first and second interlocking members 213, 223 to cooperatively sandwich the retained portion 231 of the seal rim 23 therebetween. With the fitting engagement of the protrusions 224 and the positioning bores 233, undesired movement of the seal rim 23 can be prevented to firmly retain the seal rim 23 to the door panels 21, 22.

Alternatively, the protrusions 224 may be formed on and extend from the rearwardly facing wall surface 2111 of the front door panel 21, and may be fitted in the positioning bores 233 of the seal rim 23, respectively.

The sealing portion 232 is configured to flare rearwardly from the retained portion 231 to have a tip end projecting radially and outwardly of the rim flange 212 so as to be sandwiched between the front door panel 21 and the container body 1 to seal the clearance therebetween.

Figure 4:
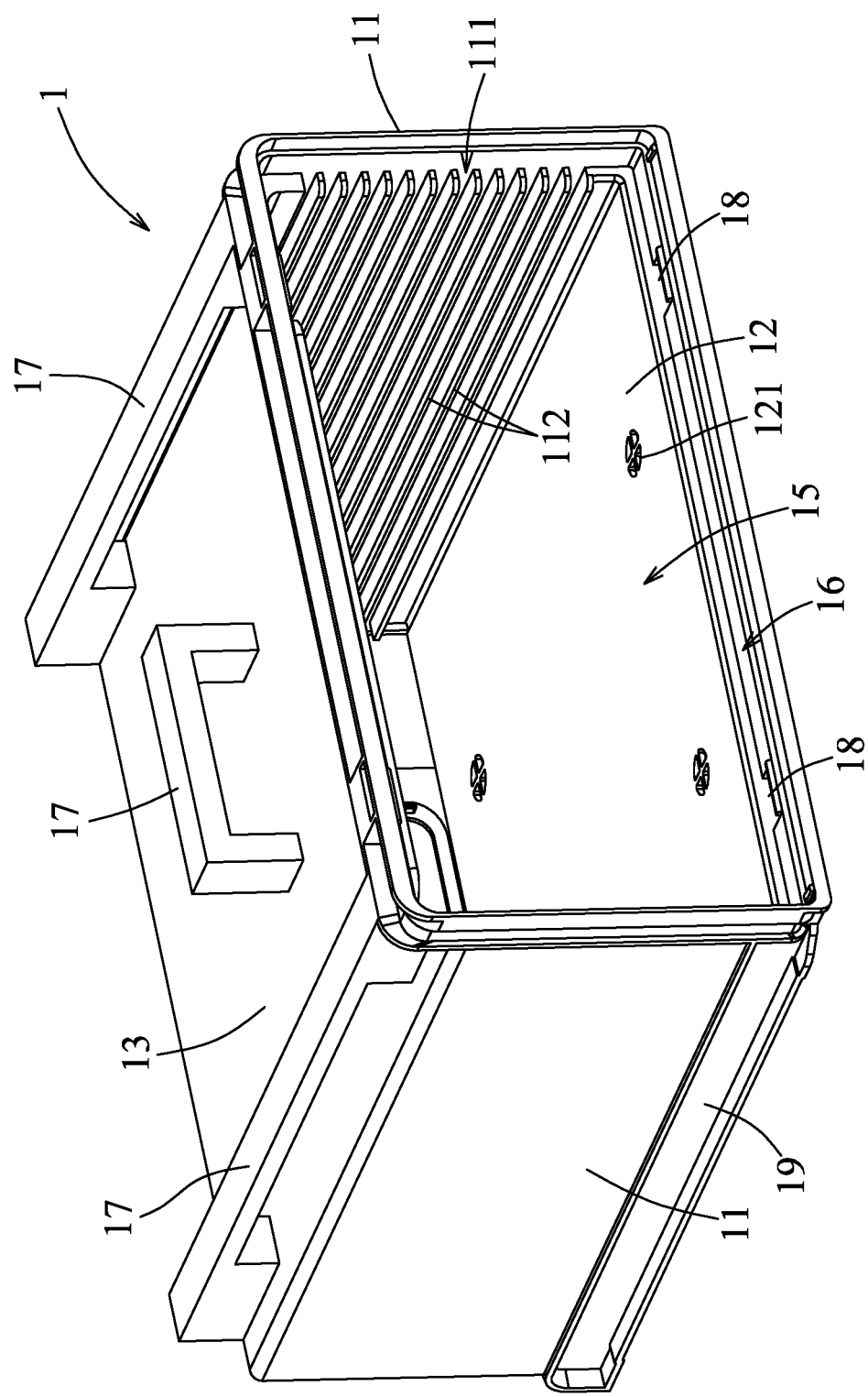
FIG. 4 is a perspective view of the embodiment, in which a door of the embodiment is removed.
Figure 11:
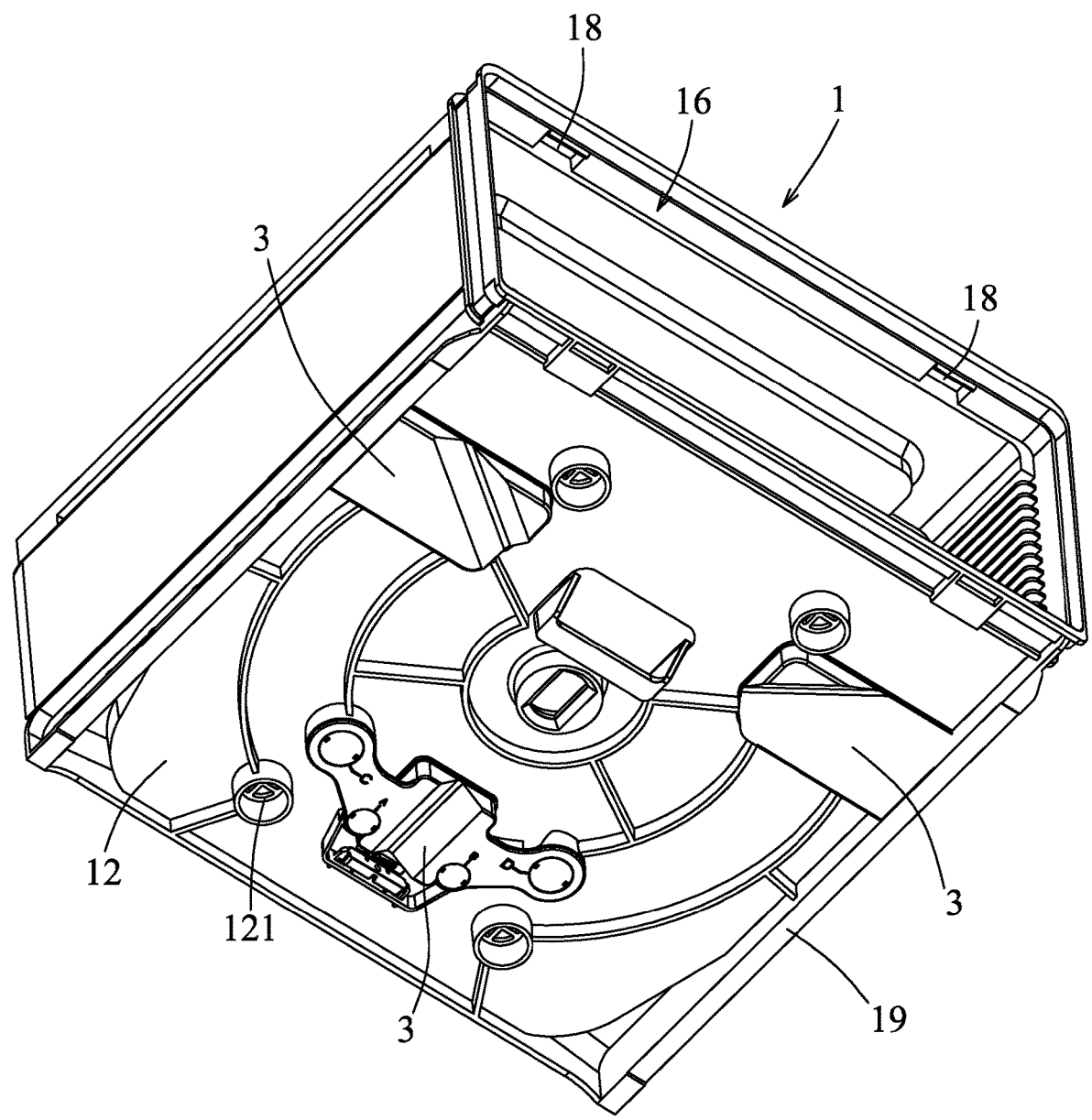
FIG. 11 is a perspective view of the embodiment taken from another angle, in which the door is removed.

With reference to FIGS. 3, 4 and 11, in this embodiment, the door 2 further includes two latching mechanisms (not shown) disposed between the front door panel 21 and the rear door panel 22. Each of the bottom and top walls 12, 13 has two latching slots 18 for engaging the latching mechanisms to fasten the door 2 on the container body 1.

Also, the front door panel 21 has two key holes 214 for insertion of two keys (not shown) to operate the two latching mechanisms respectively so as to lock or unlock the door 2 relative to the container body 1. The front door panel 21 further has two positioning holes 215 for being engaged with two robotic handling mechanisms (not shown) of a processing tool to hold and automatically move the door 2.

Figure 5:
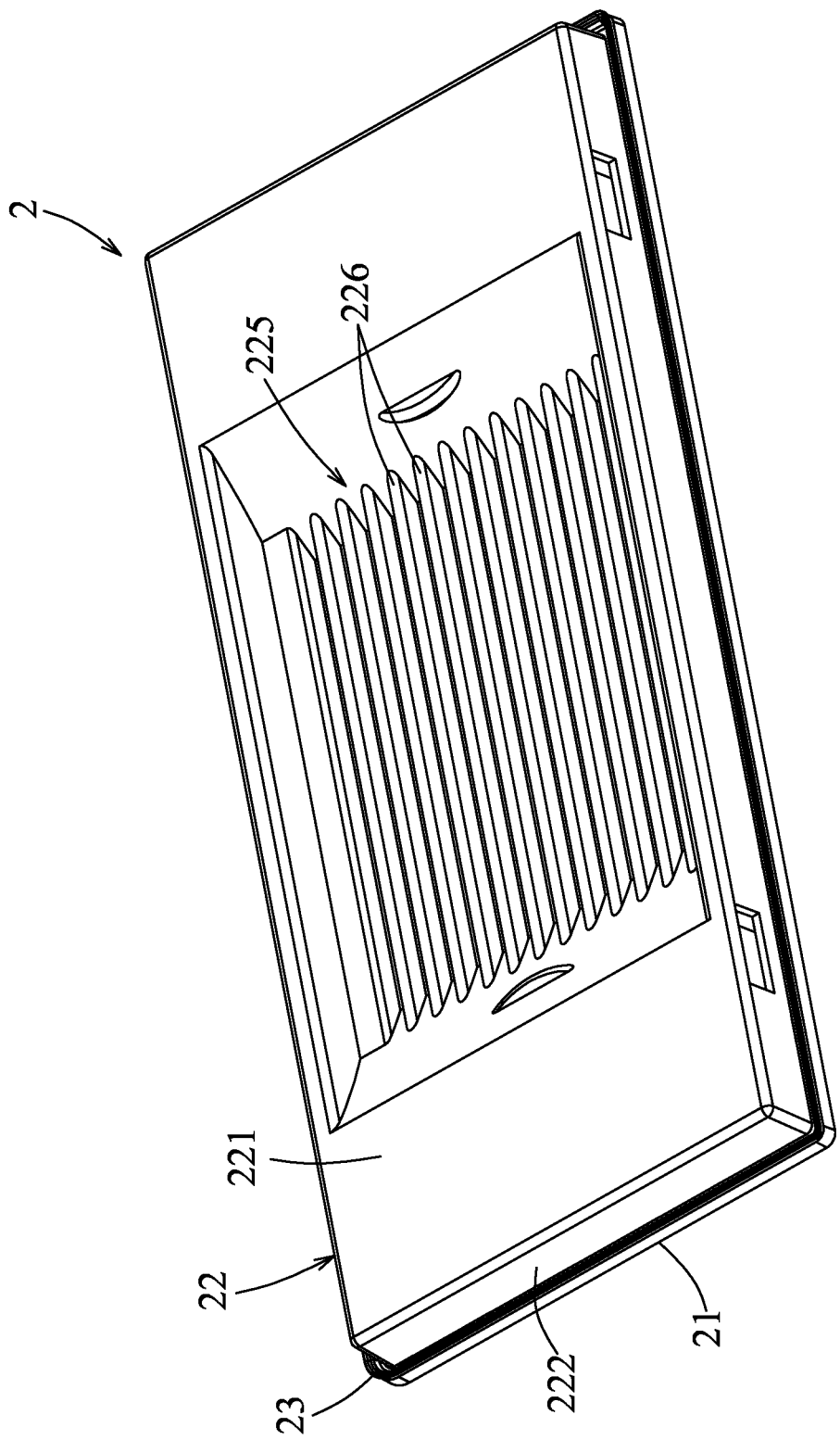
FIG. 5 is a perspective view of the door of the embodiment.
Figure 6:
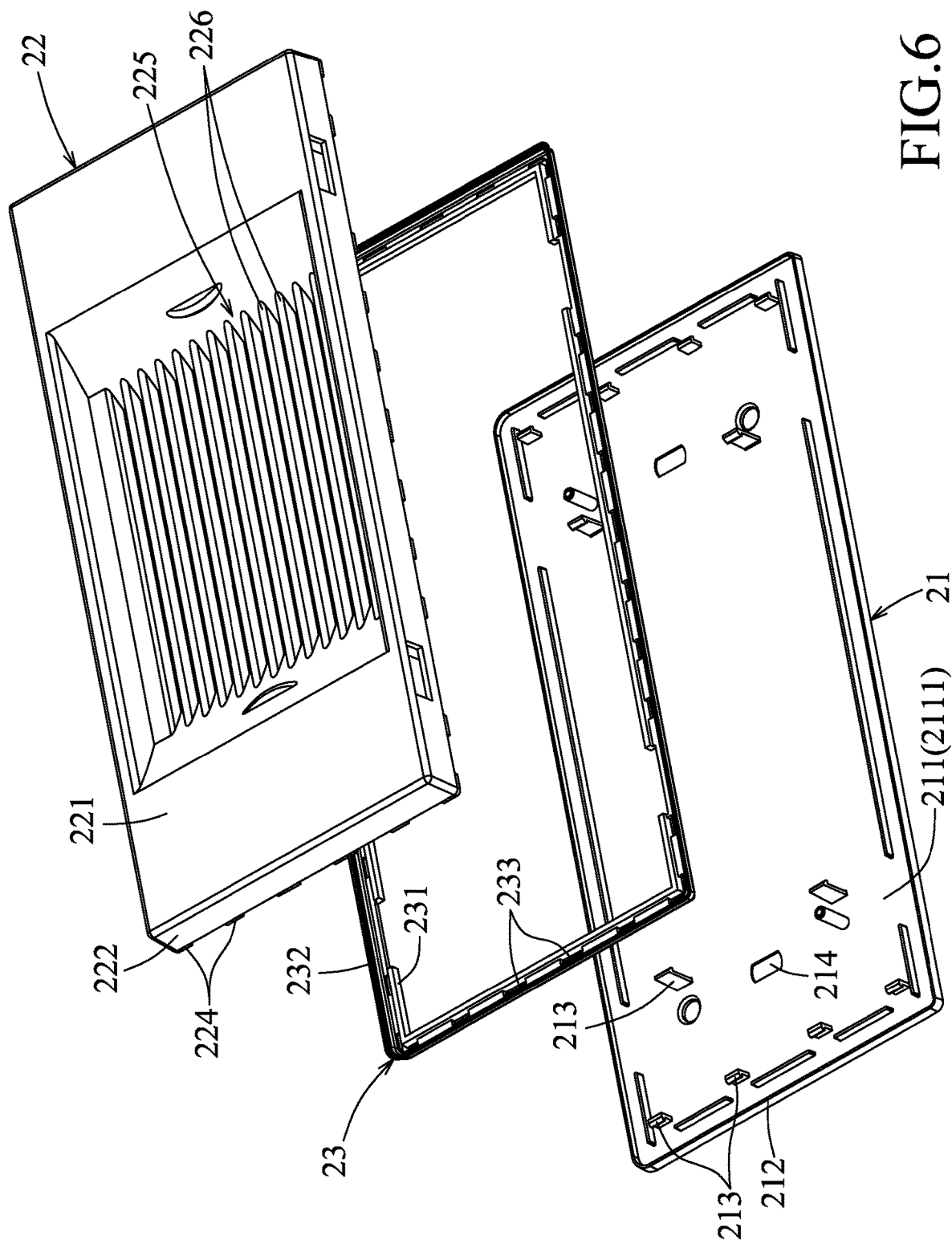
FIG. 6 is an exploded perspective view of the door of the embodiment.
Figure 7:
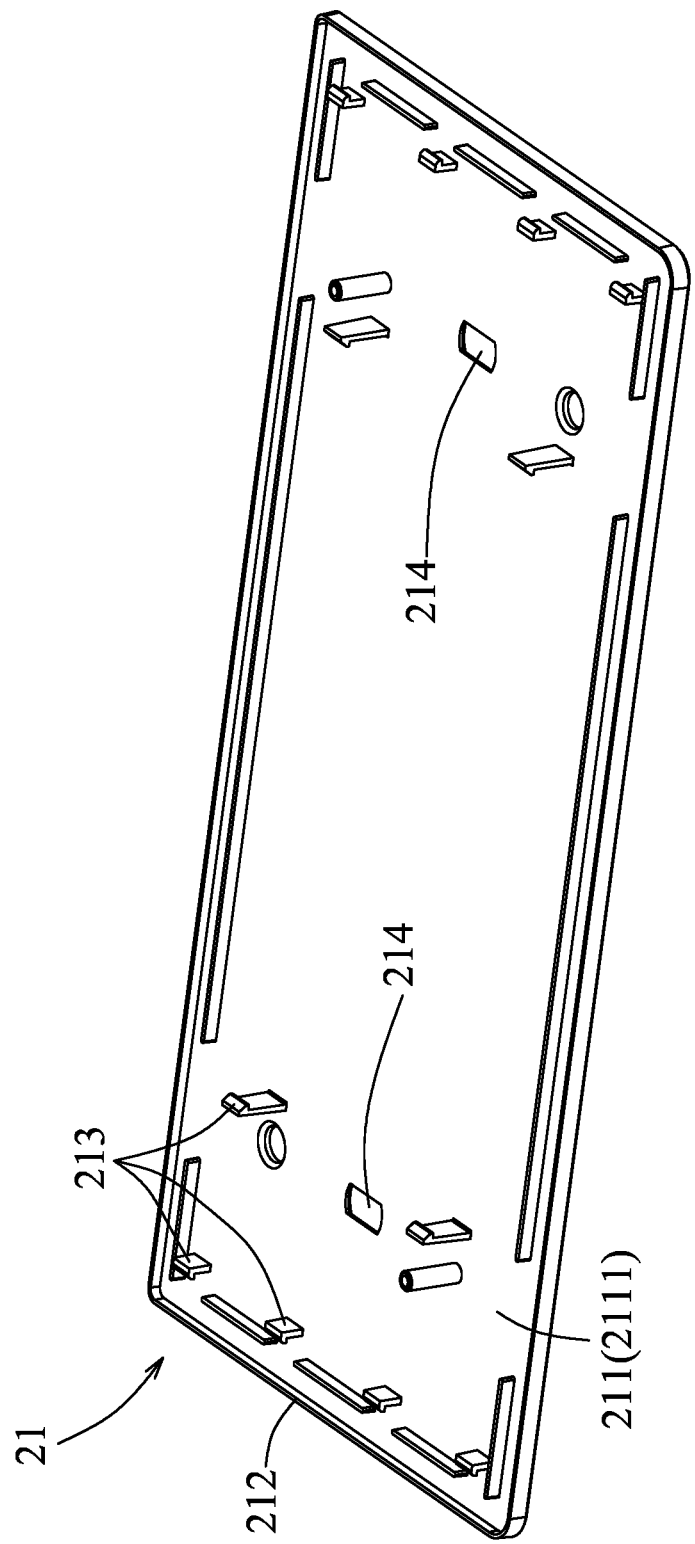
FIG. 7 is a perspective view of a front door panel of the door.
Figure 8:
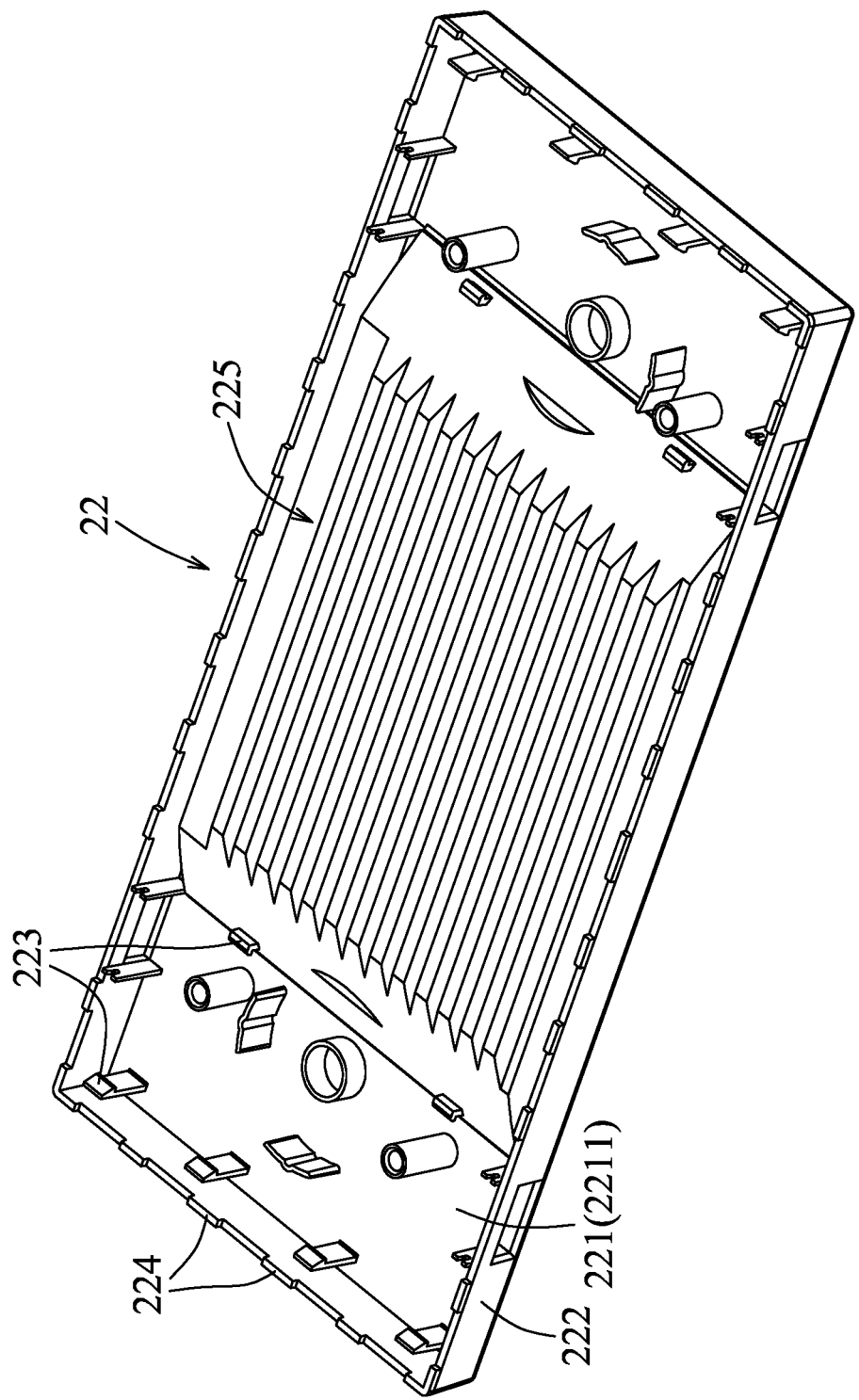
FIG. 8 is a perspective view of a rear door panel of the door.

With reference to FIGS. 3 to 5, the side walls 11 of the container body 1 are disposed laterally of the door 2. Two wafer supporting portions 111 are formed respectively on interior surfaces of the side walls 11 to extend in the container space 15, and to cooperatively support wafer assemblies (not shown) spaced apart in an upright stack in the container space 15. Each wafer assembly may be a wafer or a wafer frame. Specifically, each wafer supporting portion 111 has a plurality of supporting ribs 112 arranged in an upright direction and each extending in the front-and-rear direction.

In a conventional FOUP (Front Opening Unified Pod) of the semiconductor manufacturing industry, the lateral supporting members are discretely mounted on the container body. The wafer supporting portions 111 are integrally formed with the side walls 11 in this embodiment, which abbreviates an assembling step and dispenses with fastening and connecting mechanisms to render the wafer container lighter and to enhance the structural strength of the wafer container.

Similarly, a wafer retaining portion 225 is formed on the rear side of the rear door panel 22, and is configured to retain the wafer assemblies in the container space 15. In this embodiment, the wafer retaining portion 225 includes a plurality of retaining ribs 226 arranged in the upright direction and each extending in the left-and-right direction. Two adjacent retaining ribs 226 cooperatively grip a side edge of a wafer assembly to protect the wafer assembly from undesired movement during transportation.

In this embodiment, the wafer retaining portion 225 is integrally formed with the rear major wall 221 and at a recessed central area of the rear major wall 221.

Figure 2:
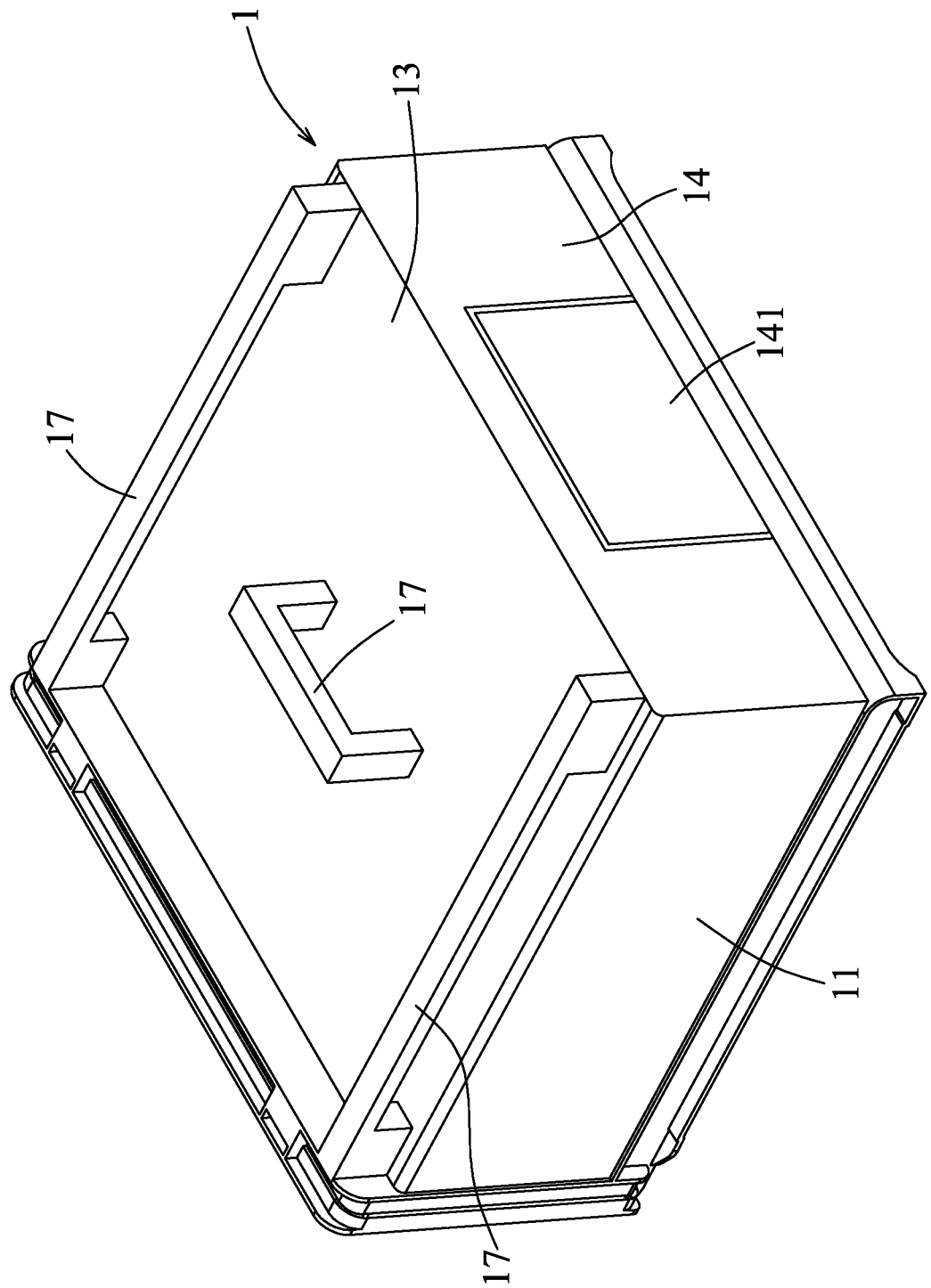
FIG. 2 is a perspective view of the embodiment, taken from another angle.

As shown in FIG. 2, a translucent window 141 is disposed on the rear wall 14 for an operator to observe the interior of the container body 1 therethrough. The translucent window 141 can be integrally formed with the rear wall 14 for enhancing the structural strength of the container body 1.

With reference to FIGS. 1, 3 and 11, the container body 1 has one or more handles 17, such as two handles spaced apart from each other for an operator to grip or hold, which are disposed on an outer surface of the top wall 13. The handles 17 may be disposed on the top wall 13 through an assembling process, or collapsibly mounted on the top wall 13. Alternatively, in this embodiment, the handles 17 are integrally formed with the top wall 13 as a one-single piece structure. Specifically, the container body 1 (including the handles 17) has an integrally formed structure to abbreviate the assembling process and have a great structural strength.

In this embodiment, a central handle 17 is further disposed on a center of the top wall 13 so as to be gripped and held by an operator with one hand. Alternatively, other handle structure may be employed, such as a robot handling member (not shown), for being engaged by a robot (not shown) for automatic operation.

The wafer container further includes a plurality of kinematic coupling pins 3 connected to the bottom wall 12 and disposed in the base seat 19 for facilitating positioning of the wafer container on a processing equipment (not shown) to permit a robotic arm to accurately pick up the wafers in the wafer container. Three of the kinematic coupling pins 3 as shown in FIG. 3 are generally provided to conform to the standard issued by SEMI (Semiconductor Equipment and Materials International).

The kinematic coupling pins 3 may be integrally formed with or connected with the bottom wall 12 in the base seat 19. Moreover, the bottom wall 12 has a plurality of air holes 121 for charging or discharging the container space 15.

As illustrated, with the retained portion 231 sandwiched between the front and rear door panels 21, 22, the sealing portion 232 of the seal rim 23 is firmly disposed to seal the clearance between the door 2 and the container body 1. Moreover, the side walls 11, the top wall 13, the rear wall 14, the bottom wall 12, the base seat 19 and the handles 17 may be integrally formed to be a one-single piece, which reinforces the structural strength and results in a light weight, a less number of component parts, and a simplified assembling process. Likewise, the rear door panel 22 may be integrally formed with the wafer retaining member 225, which reduces the number of the component parts and simplifies the assembling process.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A wafer container comprising:
    a container body having a pair of upright side walls which are spaced apart from each other in a left-and-right direction, a top wall interconnecting upper ends of said side walls, a bottom wall interconnecting lower ends of said side walls, a rear wall connected to a rear end of each of said side, top and bottom walls, and a base seat disposed under said bottom wall, wherein said side, top and bottom walls together define within said container body a container space having a front access opening opposing to said rear wall; and
    a door removably engaged with said container body to close and to seal said front access opening, said door including a front door panel, a rear door panel, and a seal, wherein said front door panel has a front major wall having a rearwardly facing wall surface, said rear door panel has a rear major wall having a forwardly facing wall surface, and a rim flange extending forwardly from a periphery of said rear major wall, a periphery of said front door panel is larger than a periphery of said rear door panel such that an outer portion of said rearwardly facing wall surface of said front door panel is not covered by said rear door panel, said seal being disposed adjacently to said outer portion of said rearwardly facing wall surface of said front door panel or to an edge of said rim flange to seal a gap between said door and said container body when said door is engaged with said container body to close said front access opening.

2. The wafer container as claimed in claim 1, wherein said seal includes a seal rim, said seal rim having a retained portion that is sandwiched between said rear door panel and said front door panel, and a sealing portion that extends outwardly from and surrounds said retained portion, said sealing portion being disposed between outer peripheries of said front door panel and said rear door panel so as to be in pressure contact with said container body to be tightly fitted into a clearance between said container body and said door.

3. The wafer container as claimed in claim 2, wherein said retained portion of said seal rim has a plurality of positioning bores, said rear door panel having a plurality of protrusions which are fitted in said positioning bores, respectively.

4. The wafer container as claimed in claim 2, wherein said retained portion of said seal rim has a plurality of positioning bores, said front door panel having a plurality of protrusions which are fitted in said positioning bores, respectively.

5. The wafer container as claimed in claim 1, wherein said side walls, said top wall, said rear wall, said bottom wall and said base seat are integrally formed with each other as a one-single piece structure.

6. The wafer container as claimed in claim 1, wherein said front door panel has a plurality of first interlocking members, said rear door panel having a plurality of second interlocking members disposed to be snap-fitted to said first interlocking members, respectively, so as to firmly connect said front and rear door panels.

7. The wafer container as claimed in claim 1, wherein said container body has at least one handle which is disposed on said top wall for being transported.

8. The wafer container as claimed in claim 7, wherein said handle is integrally formed with said top wall as a one-single piece structure.

9. The wafer container as claimed in claim 7, wherein said handle is removably attached to said top wall.

10. The wafer container as claimed in claim 7, wherein said container body has a wafer supporting portion formed on each of said side walls, and extending toward said container space.

11. The wafer container as claimed in claim 1, wherein said door has a wafer retaining portion integrally formed on said rear door panel.

12. The wafer container as claimed in claim 1, wherein said seal is disposed on said rearwardly facing wall surface of said front door panel in an integral form to be matingly and sealingly engaged with said front access opening.

13. A wafer container comprising:
    a container body having a pair of upright side walls which are spaced apart from each other in a left-and-right direction, a top wall interconnecting upper ends of said side walls, a bottom wall interconnecting lower ends of said side walls, a rear wall connected to a rear end of each of said side, top and bottom walls, and a base seat disposed under said bottom wall, wherein said side, top and bottom walls together define within said container body a container space having a front access opening opposing to said rear wall; and
    a door removably engaged with said container body to close and to seal said front access opening, said door including a front door panel, a rear door panel, and a seal, wherein a periphery of said front door panel is larger than a periphery of said rear door panel, and said seal is disposed at said periphery of said front door panel and configured to seal a gap between said door and said container body when said door is engaged with said container body to close said front access opening,
    wherein said seal includes a seal rim, said seal rim having a retained portion that is sandwiched between said rear door panel and said front door panel, and a sealing portion that extends outwardly from and surrounds said retained portion, said sealing portion being disposed between outer peripheries of said front door panel and said rear door panel so as to be in pressure contact with said container body to be tightly fitted into a clearance between said container body and said door, and wherein said retained portion of said seal rim has a plurality of positioning bores, said rear door panel having a plurality of protrusions which are fitted in said positioning bores, respectively.

14. A wafer container comprising:
a container body having a pair of upright side walls which are spaced apart from each other in a left-and-right direction, a top wall interconnecting upper ends of said side walls, a bottom wall interconnecting lower ends of said side walls, a rear wall connected to a rear end of each of said side, top and bottom walls, and a base seat disposed under said bottom wall, wherein said side, top and bottom walls together define within said container body a container space having a front access opening opposing to said rear wall; and
a door removably engaged with said container body to close and to seal said front access opening, said door including a front door panel, a rear door panel, and a seal, wherein a periphery of said front door panel is larger than a periphery of said rear door panel, and said seal is disposed at said periphery of said front door panel and configured to seal a gap between said door and said container body when said door is engaged with said container body to close said front access opening,
wherein said seal includes a seal rim, said seal rim having a retained portion that is sandwiched between said rear door panel and said front door panel, and a sealing portion that extends outwardly from and surrounds said retained portion, said sealing portion being disposed between outer peripheries of said front door panel and said rear door panel so as to be in pressure contact with said container body to be tightly fitted into a clearance between said container body and said door, and
wherein said retained portion of said seal rim has a plurality of positioning bores, said front door panel having a plurality of protrusions which are fitted in said positioning bores, respectively.

\* \* \* \* \*